(12) United States Patent
Zou et al.

(10) Patent No.: US 6,748,280 B1
(45) Date of Patent: Jun. 8, 2004

(54) SEMICONDUCTOR RUN-TO-RUN CONTROL SYSTEM WITH STATE AND MODEL PARAMETER ESTIMATION

(75) Inventors: Jianping Zou, Austin, TX (US); James A. Mullins, Round Rock, TX (US); Keith A. Edwards, Austin, TX (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 10/171,758

(22) Filed: Jun. 14, 2002

Related U.S. Application Data

(63) Continuation-in-part of application No. 10/046,359, filed on Oct. 23, 2001.

(51) Int. Cl.$^7$ .............................................. G05B 13/02
(52) U.S. Cl. ......................................... 700/31; 700/30
(58) Field of Search .............................. 700/29–31, 44, 700/45, 52, 121

(56) References Cited

U.S. PATENT DOCUMENTS

| | | | |
|---|---|---|---|
| 5,402,367 A | 3/1995 | Sullivan et al. | 364/578 |
| 5,448,684 A * | 9/1995 | Holt | 706/20 |
| 5,661,669 A | 8/1997 | Mozumder et al. | 364/552 |
| 5,710,700 A * | 1/1998 | Kurtzberg et al. | 700/29 |
| 5,859,964 A | 1/1999 | Wang et al. | 395/185.01 |
| 5,926,690 A | 7/1999 | Toprac et al. | 438/17 |
| 6,002,839 A * | 12/1999 | Keeler et al. | 706/23 |
| 6,148,239 A | 11/2000 | Funk et al. | 700/1 |
| 6,230,069 B1 | 5/2001 | Campbell et al. | 700/121 |
| 6,232,134 B1 | 5/2001 | Farber et al. | 438/9 |
| 6,248,602 B1 | 6/2001 | Bode et al. | 438/14 |
| 6,542,782 B1 * | 4/2003 | Lu | 700/29 |
| 6,594,620 B1 * | 7/2003 | Qin et al. | 702/185 |
| 2002/0002414 A1 * | 1/2002 | Hsuing et al. | 700/95 |

FOREIGN PATENT DOCUMENTS

WO  WO 00/79355 A1  12/2000

\* cited by examiner

*Primary Examiner*—Leo Picard
*Assistant Examiner*—R Jarrett
(74) *Attorney, Agent, or Firm*—Perman & Green, LLP; Richard Pickreign

(57) ABSTRACT

A method for a run-to-run (R2R) control system includes processing materials using a process input and producing a process output, storing the process input in a database, the storing including using a timestamp, and storing at least one measurement of the process output in the database aligned with each process input using the timestamp. The method further includes iterating over the data in the database to estimate one or more coefficients for a model, and, if one or more measurements is missing, replacing the missing measurements based on a prediction from said model. The model is updated with said coefficient estimates. The method additionally includes iterating over the data from the database to estimate a process state, and, if one or more of the measurements is missing from the database, replacing the missing measurements based on prediction from the model. The model is updated with said process state estimate. A controller may receive the updated model and utilize the model to produce the next process input. The updated model may also be utilized to generate an estimate for a measurable process variable, wherein the estimate can be compared to an actual measurement to determine if the estimate is within confidence limits. If the estimate is not within confidence limits, a fault is indicated.

37 Claims, 5 Drawing Sheets

SEMICONDUCTOR RUN-TO-RUN CONTROL SYSTEM WITH STATE AND MODEL PARAMETER ESTIMATION

RELATED APPLICATIONS

This application is a continuation-in-part to the patent application entitled SEMICONDUCTOR RUN-TO-RUN CONTROL SYSTEM WITH MISSING AND OUT-OF-ORDER MEASUREMENT HANDLING, Ser. No. 10/046,359; filed Oct. 23, 2001, which is incorporated herein by reference.

BACKGROUND OF THE INVENTION

1. Field of the Invention

The present invention relates to the field of semiconductor processing and, more particularly, to run-to-run control in semiconductor processing.

2. Description of the Related Art

Run-to-run (R2R) control and fault detection (FDC) in semiconductor processing refers to the practice of updating equipment recipe settings based upon product measurements that occur after process completion. The practice applies in the semiconductor industry due to the inability to measure the product characteristics in situ. For example, in the chemical-mechanical-planarization (CMP) process, pad rotational speeds, applied forces, and other parameters are measurable, but the film thickness, the actual product variable, is not. Similarly, in lithography, the exposure power, exposure time and focus may be determined, but the actual overlay errors are not measured until after the development of the resist, a separate process occurring long after the lithographic exposure. Other examples exist, but the primary applications occur in lithography (overlay and critical dimension (CD)), plasma etch and CMP.

The best way to implement effective R2R control is with an approach using a reliable process model due to the long measurement delays often associated with these implementations. However, a common problem in the R2R control and FDC of these processes is that the model coefficients are not well known and that the experiments to refine the values are too laborious. A need exists for an approach to simultaneously estimate the state of the process and refine the model coefficients using data gathered during closed-loop controller operation. Complicating this problem is the fact that some of the state variables and some of the model coefficients reflect information on different components of the problem. For example, some coefficients may be product dependent, but not tool dependent. Some of the state variables may reflect the state of some aspect of the tool and others may reflect the contribution of a consumable or auxiliary component, like a reticle. A method that accommodates these needs in effective R2R control would solve many manufacturing difficulties in making semiconductors.

In the prior art, a method for combined state and parameter estimation in a run-to-run control application has not been available. Various approaches to parts of the problem are known. In the prior art, state estimation is utilized to estimate the tool state from the measured data, assuming the product contributions are known, constant and included in the model. However, if the model contains some coefficient errors, an inevitable eventuality, then using the control system to control processes producing more than one product causes apparent disturbance changes each time the product changes. Product changes in a typical foundry fab occur essentially every lot of wafers. Thus, disturbance estimation with a constant model delivers performance that is highly dependent on the accuracy of the model coefficients.

In the prior art, others implement an adaptive form of the estimator that estimates a model coefficient that characterizes the current state of the tool, but ignores the additive disturbance contributed by the process tool or consumables in the process. This approach introduces the same problem as disturbance estimation alone. The controller attributes all of the error to the model coefficients. Since different products have different model coefficients, and the tool disturbance is commingled with product contribution in the coefficients, when products are switched in production, the errors propagate, appearing in the output as random errors. However the errors are not random, but instead are due to the inability of the system to properly assign the sources of errors.

What is needed is a method to combine the capability to do both additive state disturbance estimation and model parameter estimation so that the error sources are properly assigned, allowing product switching with minimum system upset. What is further needed is an approach to this problem that (i) combines parameter and state/parameter estimation using manufacturing data to simultaneously refine the product and auxiliary model contributions; and (ii) estimates the tool state.

SUMMARY OF THE INVENTION

Having a reliable process model is essential to implementing an effective run-to-run (R2R) control system, particularly in view of the long measurement delays associated with such systems. A need has existed for an approach that both estimates the state of the process and refines the model coefficients using data gathered during closed-loop controller operation.

In accordance with the present invention, a method for combined state and parameter estimation in a R2R control application is provided. More particularly, the method for controlling a manufacturing process includes: processing materials using a process input and producing a process output, storing the process input in a database, the storing including using a timestamp, and storing at least one measurement of the process output in the database aligned with each process input using the timestamp. The method further includes iterating over the data in the database to estimate one or more coefficients for a model, and, if one or more measurements is missing, replacing the missing measurements based on a prediction from said model. The model is updated with said coefficient estimates. The method additionally includes iterating over the data from the database to estimate a process state, and, if one or more of the measurements is missing from the database, replacing the missing measurements for the database based on prediction from the model. The model is updated with said process state estimate. The replacement of missing measurements during parameter or state estimation can be accomplished implicitly or explicitly. A controller may receive the updated model and utilize the model to produce the next process input. The updated model may also be utilized to generate an estimate for a measurable process variable, wherein the estimate can be compared to an actual measurement to determine if the estimate is within confidence limits. If the estimate is not within confidence limits, a fault is indicated.

According to one embodiment, the method includes one or more modules coupled to the database, the one or more modules including at least a sorting module configured to sort measurements received asynchronously from the process according to the timestamp, the sorted measurements including later arriving measurements to allow the next process input to be based at least in part on an error calculated using later available measurements. The sorting module also sorts the data in the database for use during parameter estimation or state estimation.

If actual measurements become available a time period after model coefficient estimation or process state estimation, for one or more measurements which was missing, the predicted measurements for the previously missing measurements are replaced with the actual measurements, and the actual measurements are stored in the database. In subsequent model coefficient estimation and process state estimation, the actual measurements are used in place of the predicted measurements. The time period during which one is waiting for the actual measurements to become available may be variable in the present invention.

In one embodiment, the state estimator filter and parameter estimator filter comprise separate receding-horizon filters that compute estimates using a constrained least-squares approach. The least-squares optimization requires the solution to a quadratic program.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

I. Overview

The embodiments of the present invention as described below provide features that may be altered or developed according to specific development goals, business concerns and system requirements that may vary from one implementation to another. It will be appreciated that any such alterations of the features of the present invention would be a routine undertaking for those of ordinary skill in the art having the benefit of this disclosure.

The present invention provides a method and system for efficiently and accurately processing materials, for which processing measurements are collected asynchronously from material processing, such as in semiconductor processing. The present invention also provides a method for combined state and parameter estimation in a R2R control application.

Figure 1:
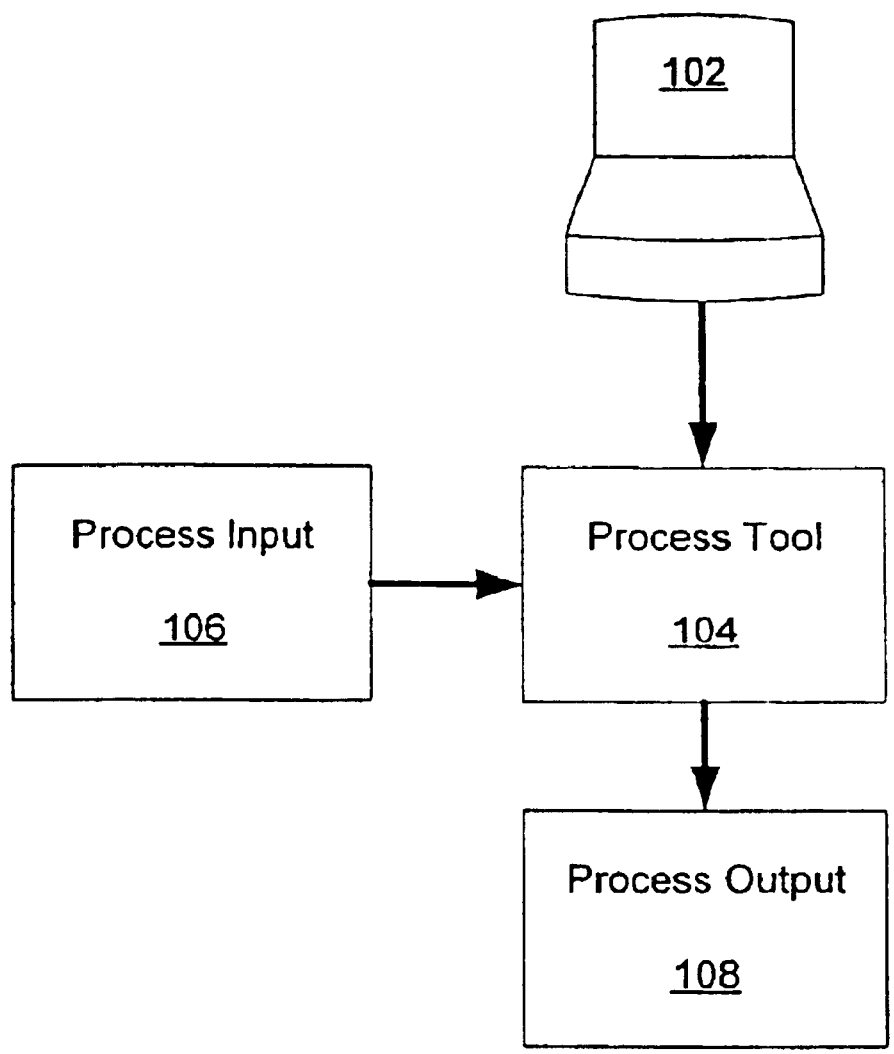
FIG. 1, labeled "prior art", illustrates an exemplary processing system of semiconductor wafers by a semiconductor tool.

Referring to FIG. 1, an embodiment of a prior art control system shows a process input 106, which may be raw materials, partially processed materials, or other process inputs, such as semiconductor materials, that are processed on a process tool 104. Controller 102 is coupled to process tool 104 to provide one or more control input signals. Process tool 104 processes the materials of process input 106 and outputs process output 108.

Figure 2:
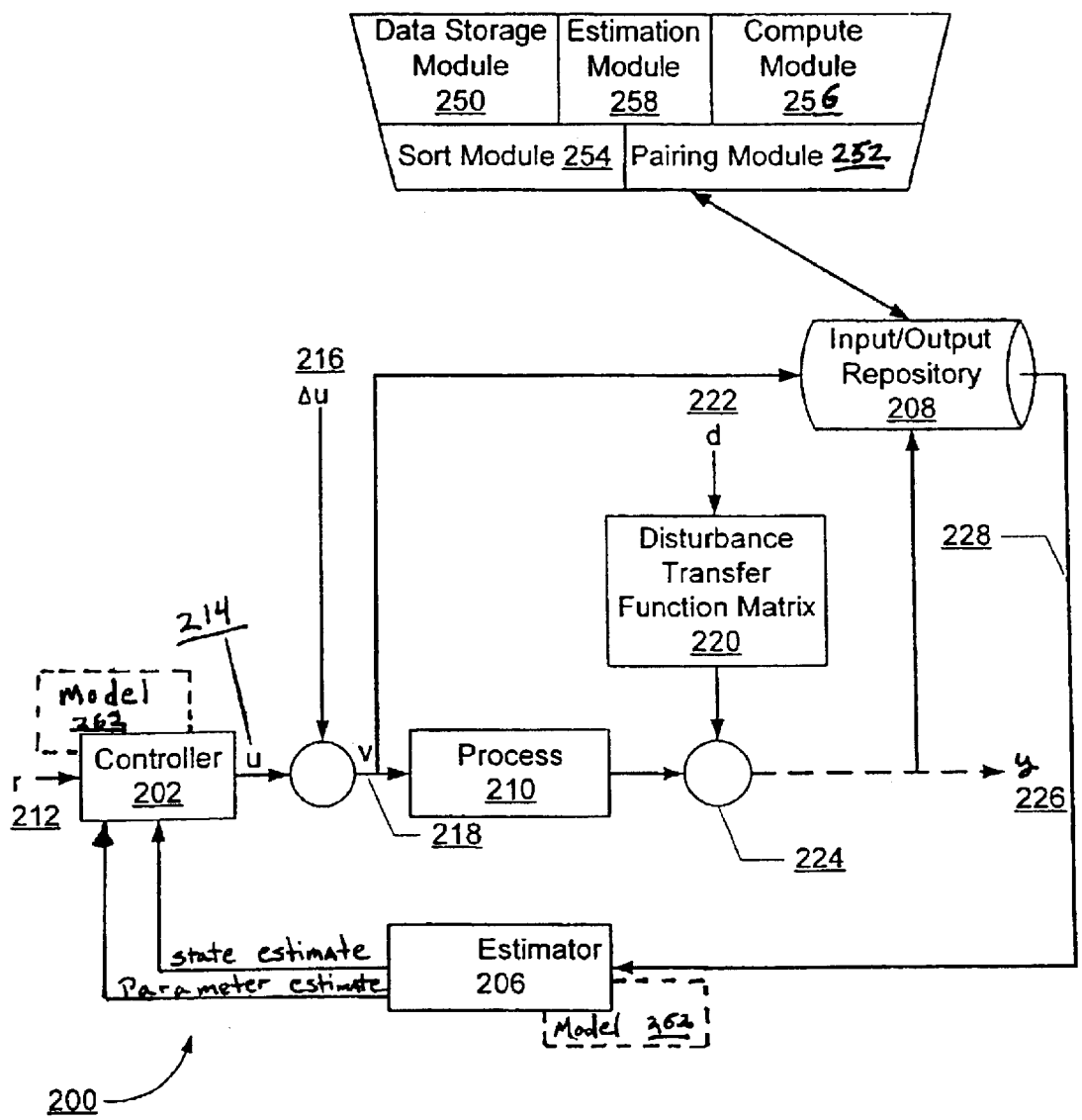
FIG. 2 is a block diagram of a control system in accordance with an embodiment of the present invention.

Referring now to FIG. 2, an R2R control system in accordance with the present invention is shown. Control system 200 includes a process 210 for processing materials coupled to a controller 202. Controller 202 receives a process setpoint r 212 and outputs computed process inputs u 214. Process 210 receives an actual process input v 218 which includes the computed process input 214, as altered by an operator-induced input disturbance Δu 216. Actual process input v 218 is further received by an input/output repository 208, which may be implemented as a database.

Process 210, like process tool 104, processes materials and outputs processed products requiring measurements. Process 210 delivers the products and the parameters of the products. The output of the process tool 210 is measured. The measurements are shown as block 224 and include: (i) measurements that are done in situ; (ii) measurements done shortly after processing; and (iii) later accomplished measurements. Control system 200 operates on the measurements to add a disturbance d 222 via a transfer function, such as disturbance transfer function matrix 220. The process measurements are shown as process output y 226 and are further provided to input/output repository 208. Importantly, measurements y 226 are generally collected asynchronously from actual material processing in process tool 210. Thus, the input measurement of such to process tool 210 may be shown as a dashed line.

Input/output repository 208 provides data 228 to both a model 262 and to a state/parameter estimator 206. Input/output repository 208 can be implemented as a database that accumulates past inputs and measurements. Input/output repository 208 further includes a sorter for sorting the inputs and measurements according to a process timestamp and a receding horizon filter or an appropriate substitute filter that handles missing measurements. Sorter also sorts the data for use during either state estimation or parameter estimation. State/parameter estimator 206 receives data from model 262 as well and provides an updated model to controller 202. Controller 202, unlike controller 102, computes process inputs based on the updated model. The model is updated based on coefficient and process state estimates computed by state/parameter estimator 206.

As described in more detail below, the state/parameter estimator 206 employs more than one filter as estimators for different components of the model 262. State/parameter estimator 206 employs one filter for parameter estimation and another filter for state estimation.

In operation, between process runs, none, one, or a plurality of measurements on a product from past process runs may be performed by measurement tool 224.

Coupled to input/output repository 208 are several modules 250–258. The modules include data storage module 250 that captures and stores actual process vectors and measured process output vectors from the input/output repository 208. Pairing module 252 pairs the process input and output vectors according to a process timestamp or a plurality of predicted process timestamps. Sorting module 254 sorts the input/output vector pairs according to the process timestamp (s). Sorting module 254 also sorts the data for use during either state estimation or parameter estimation. Compute module 256 computes a predicted process output or a plurality of process outputs using the process model, and estimation module 258 estimates a process state vector from process inputs, output predictions and actual output vectors. In addition, estimation module 258 estimates updated model coefficients from process outputs, the model output predictions and the actual output vectors.

More particularly, data storage module 250 and pairing module 252 include routines to capture the actual process input v 218, attach a timestamp signifying the start of the process 210, store the input v 218 into a sorted list of process input/output pairs for maintenance in input/output repository 208, capture the product measurements y 226 and affiliate them with the corresponding process input v 218 in the stored list within the input/output repository 208.

Input/output repository 208 may be implemented as a database for storing the coordinated input/output pairs for each unit of product. In a semiconductor processing environment, the unit of product may be implemented as a lot of wafers or individual wafers, depending on the granularity of control of a particular site and configuration parameters for the state/parameter estimator 206. Furthermore, the configuration parameters may include the horizon length, the expiration date for measurements and weight matrices. The expiration date of the measurements is a timestamp prior to which the system 200 ignores all process inputs and product measurements. Further configuration parameters are described below.

II. Process Model

Process model 262 can be characterized as follows:

$$x_{k+1} = A^j x_k + B^j u_k + G^j d_k$$

$$d_{k+1} = \alpha d_k + w_k$$

$$y_k^j = C^j x_k + v_k \quad (1)$$

The explanation of the symbols appearing in Equation (1) appears in Table 1 below. The choice of $\alpha$ and a model for w allow one skilled in the art to shape the underlying disturbance model for the system. Table 2 gives a description of the resulting disturbance model for various choices for $\alpha$ and w, which is a white noise process. In addition, the disturbance may be composed of several sub-vectors each containing information about the tool's, a durable's (e.g., reticle), or a product layer's additive contribution to the state model. The modifications to Equation (1) required to accommodate these separate contributions would be known to those skilled in the art. The matrices A, B, and G are usually known from process considerations. However, the coefficients in the matrix C, are often indicative of different products' contributions to the process outcome as measured in the output variable, y. Hence, depending on the particular process, both unknown disturbances, embodied in the variable d, and unknown model coefficients in C, may be present.

TABLE 1

Symbols for process model equations

| SYMBOL | DEFINITION |
|--------|------------|
| k | Lot or wafer index (counter). |
| x | Process state vector |
| u | Process input vector |
| d | Process state additive disturbance vector |
| y | Process output vector |

TABLE 1-continued

Symbols for process model equations

| SYMBOL | DEFINITION |
|--------|------------|
| w | Process state noise vector, usually assumed to be normally distributed white noise. |
| v | Process output noise vector, usually assumed to be normally distributed white noise. |
| j | Product index (identifier) |
| A | Process dynamic matrix. |
| B | Input gain matrix |
| G | State disturbance gain matrix |
| $\alpha$ | Disturbance dynamic matrix |
| C | Output coefficient matrix |

TABLE 2

Use of disturbance dynamic matrix to tailor the disturbance model

| $\alpha$ | Resulting d |
|----------|-------------|
| $0 < \|\alpha\| < 1$ | Stable 1$^{st}$-order dynamics with white noise |
| 1 | Integrated white noise |
| 0 | White noise |

III. Controller

Referring to controller 202, discussed above, implementations of this controller may consist of several types of controllers, including a model-predictive control (MPC) type controller, a direct model inverter type controller and simple proportional-integral controllers.

IV. State Estimation

In one embodiment, the state estimator filter of state/parameter estimator 206 is a receding-horizon filter that computes state and output error estimates using a constrained, least-squares approach. This least-squares optimization requires the solution to a quadratic program (QP). Equation (2) gives the basic formulation of the least squares problem for the estimator.

$$\min_{\{w_i, v_i\}} J = \sum_{i=-1}^{N-1} w_i^t Q_i w_i + \sum_{i=0}^{N} v_i^t R_i v_i$$

Subject to: $x_0 = \bar{x}_0 + w_{-1}$ $x_{i+1} = A_{i+1} x_i + B_{i+1} u_i + w_i \quad i=0,N-1$ $y_i = C_i x_i + v_i \quad i=0,N$ $w_{min} \leq w_i \leq w_{max}$ $f_{min} \leq F x_i \leq f_{max} \quad (2)$ Variable J is the objective function value, $w_i$ is the state error for lot i+1 in the horizon, $v_i$ is the error between the model predictions and measurements for lot i in the horizon, $Q_i$, $R_i$ are weighting matrices for lot i in the horizon, $\bar{x}_0$ is the initial condition of the state for the first lot, or wafer, in the horizon, $x_i$ is the state estimate for lot, or wafer, i in the horizon, $y_i$ is the measurement for lot, or wafer, i in the horizon, $A_{i+1}$, $B_{i+1}$, $C_{i+1}$ are state-space matrices for lot i+1 in the horizon, and $w_{min}$, $w_{max}$, $f_{min}$, F, $f_{max}$ define constraints on the state error and state estimates. The variables $w_i$, $w_{min}$, $w_{max}$, $f_{min}$, $x_i$, and $f_{max}$ are vectors of dimension $n_s \times 1$, where $n_s$ is the number of states. The variable $u_i$ is a vector of dimension $n_u \times 1$, where $n_u$ is the number of process inputs. The variables $v_i$ and $y_i$ are vectors of dimension $n_y \times 1$, where $n_y$ is the number of process outputs. Through algebraic manipulations, Equation (2) can be reformulated as follows:

$$\min_{\{w\}} J = w'(Q + M'_A R M_A)w - 2Y'RM_A w + Y'RY$$

$$\text{Subject to: } F_{min} \leq F_M(F_A w + F_B u + F_B \bar{x}_0) \leq F_{max} \quad (3)$$

where the parameters in the objective function of Equation (3) are defined as follows in (4):

$$w = \begin{bmatrix} w_{-1} \\ w_0 \\ w_1 \\ w_2 \end{bmatrix} \quad u = \begin{bmatrix} 0 \\ u_0 \\ u_1 \\ u_2 \end{bmatrix} \quad y = \begin{bmatrix} y_0 \\ y_1 \\ y_2 \\ y_3 \end{bmatrix} \quad Y = y - M_B u - M_C \bar{x}_0 \quad (4)$$

$$M_A = \begin{bmatrix} C_0 & 0 & \cdots & \cdots & 0 \\ C_1 A_1 & C_1 & \ddots & & \vdots \\ C_2 A_2 A_1 & \ddots & \ddots & \ddots & \vdots \\ \vdots & \ddots & \ddots & \ddots & 0 \\ C_N \prod_{i=N}^{1} A_i & \cdots & C_N A_N A_{N-1} & C_N A_N & C_N \end{bmatrix}$$

$$Q = \begin{bmatrix} Q_{-1} & 0 & \cdots & \cdots & 0 \\ 0 & Q_0 & \ddots & & \vdots \\ \vdots & \ddots & \ddots & \ddots & \vdots \\ \vdots & & \ddots & \ddots & 0 \\ 0 & \cdots & \cdots & \cdots & Q_{N-1} \end{bmatrix}$$

$$M_B = \begin{bmatrix} 0 & 0 & \cdots & \cdots & 0 \\ & C_1 B_1 & \ddots & & \vdots \\ \vdots & C_2 A_2 B_1 & \ddots & \ddots & \vdots \\ & & \ddots & \ddots & 0 \\ 0 & C_N \left(\prod_{i=N}^{2} A_i\right) B_1 & \cdots & C_N A_N B_{N-1} & C_N B_N \end{bmatrix}$$

$$R = \begin{bmatrix} R_0 & 0 & \cdots & \cdots & 0 \\ 0 & R_1 & \ddots & & \vdots \\ \vdots & \ddots & \ddots & \ddots & \vdots \\ \vdots & & \ddots & \ddots & 0 \\ 0 & \cdots & \cdots & \cdots & R_N \end{bmatrix}$$

$$M_C = \begin{bmatrix} C_0 \\ C_1 A_1 \\ C_2 A_2 A_1 \\ \vdots \\ C_N \prod_{i=N}^{1} A_i \end{bmatrix},$$

where $w$ is of dimension $(N+1) \cdot n_s \times 1$, $u$ is of dimension $(N+1) \cdot n_u \times 1$, $y$ and $Y$ are of dimension $(N+1) \cdot n_y \times 1$, matrix $M_A$ is of dimension $(N+1) \cdot n_y \times (N+1) \cdot n_s$, $M_B$ is of dimension $(N+1) \cdot n_y \times (N+1) \cdot n_u$, $M_C$ is of dimension $(N+1) \cdot n_y \times n_s$, $Q$ is of dimension $(N+1) \cdot n_s \times (N+1) \cdot n_s$, and $R$ is of dimension $(N+1) \cdot n_y \times (N+1) \cdot n_y$. The parameters in the constraint of Equation (3) are defined in (5) as:

$$F_{min} = \begin{bmatrix} f_{min} \\ \vdots \\ f_{min} \end{bmatrix} \quad F_M = \begin{bmatrix} F & & \\ & \ddots & \\ & & F \end{bmatrix} \quad F_{max} = \begin{bmatrix} f_{max} \\ \vdots \\ f_{max} \end{bmatrix} \quad (5)$$

$$F_A = \begin{bmatrix} I & 0 & \cdots & \cdots & 0 \\ A_1 & I & \ddots & & \vdots \\ \vdots & \ddots & \ddots & \ddots & \vdots \\ \vdots & & \ddots & \ddots & 0 \\ \prod_{i=N}^{1} A_i & \cdots & A_N A_{N-1} & A_N & I \end{bmatrix}$$

$$F_B = \begin{bmatrix} 0 & 0 & \cdots & \cdots & 0 \\ & B_1 & \ddots & & \vdots \\ \vdots & A_2 B_1 & \ddots & \ddots & \vdots \\ & & \ddots & \ddots & 0 \\ 0 & \left(\prod_{i=N}^{2} A_i\right) B_1 & \cdots & A_N B_{N-1} & B_N \end{bmatrix} \quad F_C = \begin{bmatrix} I \\ A_1 \\ A_2 A_1 \\ \vdots \\ \prod_{i=N}^{1} A_i \end{bmatrix},$$

where $F_{min}$, $F_{max}$ are of dimension $(N+1) \cdot n_s \times 1$, $F_m$, $F_A$ and $F_C$ are of dimension $(N+1) \cdot n_s \times (N+1) \cdot n_s$, and $F_B$ is of dimension $(N+1) \cdot n_s \times (N+1) \cdot n_u$.

When there are missing measurements in input/output repository 208, the missing measurements are replaced with the model predictions. This replacement can be accomplished explicitly by calculating the predicted measurement values from the model 262 and using them in place of the missing measurements. The replacement may also be accomplished implicitly by zeroing the rows of $M_A$ and $Y$ in Equations (3) and (4) that correspond to the missing measurements. Either approach forces the elements of $v_i$ in Equation (2) corresponding to the missing measurements to be 0.

The state/parameter estimator 206 can store more past values than just the number in the estimate horizon, N. It stores all data up to and including the N−1 lots (or wafers) processed immediately prior to the lot (or wafer) with the oldest missing information. When a new measurement arrives, the state/parameter estimator 206 iterates over the sorted list of IO pairs stored in the input/output repository 208 in groups of N data points, dropping the oldest and adding the next point into the horizon of N points with each iteration. If a data point with a missing value appears in any group of the N points, the state/parameter estimator 206 substitutes the model's 262 prediction for that point. It does not assume that the error for that point is zero. The state/parameter estimator 206 still estimates an error for that point during its solution of the QP.

When a measurement value for a previously missing value becomes available, the input/output repository 208 substitutes the new measurement in the sorted list held in the database. Upon the next request for a process input, the state/parameter estimator 206 uses the actual measurement instead of the model's 262 prediction for that point, and iterates over all the points from N points prior to the updated measurement to the current point, correcting prior estimates that were based upon use of the model's predictions. Although a time limit can be imposed, there is no requirement that the missing values become available within a set time period, and the time period during which the measurements become available can be variable.

Figure 3:
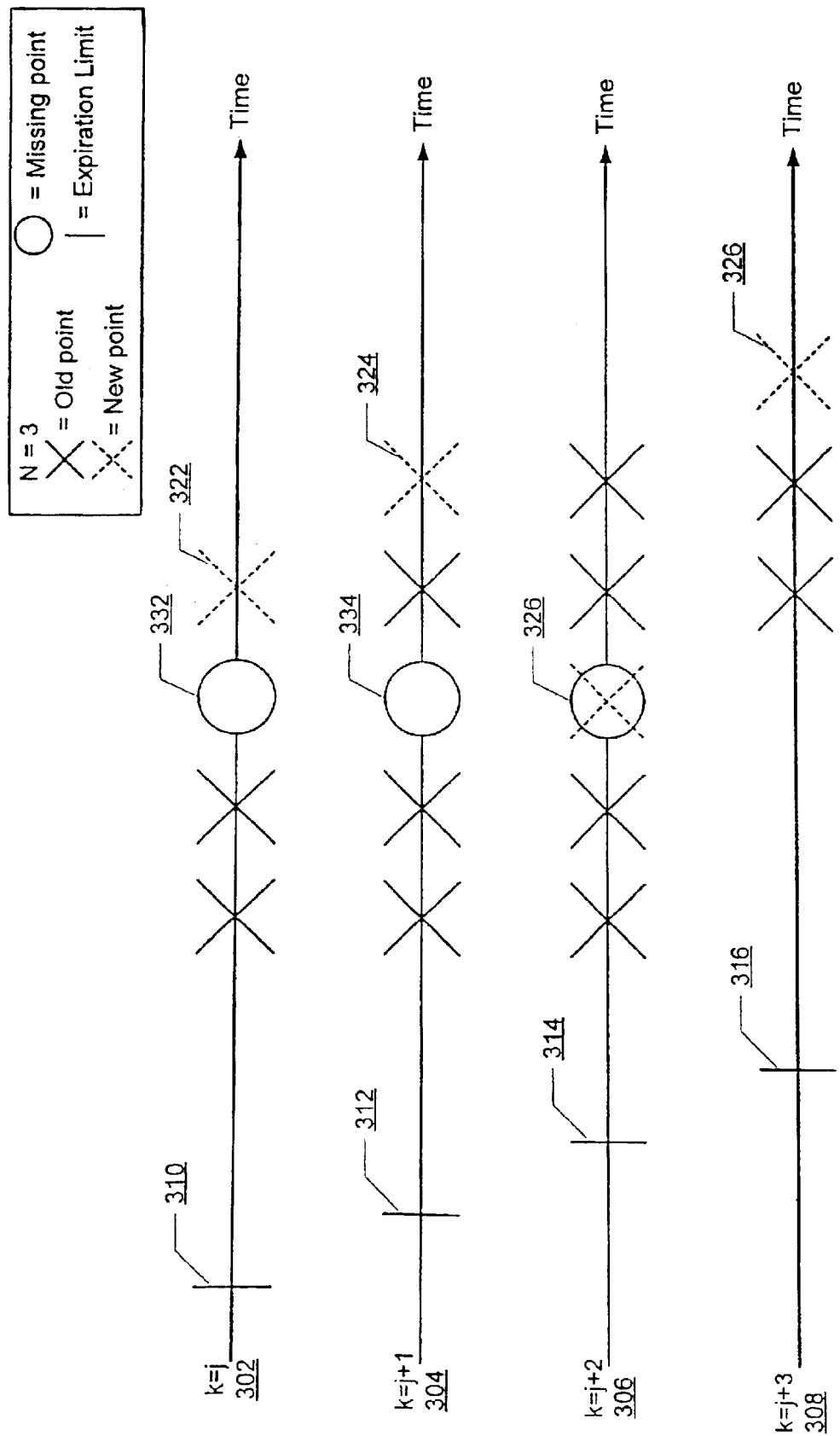
FIG. 3 is a timing diagram illustrating operation of a state/parameter estimator in accordance with an embodiment of the present invention.

Referring now to FIG. 3, a sequence progression of estimation intervals of a missing values state/parameter estimator is shown. In FIG. 3, the horizon used for configuring state/parameter estimator 206 includes a horizon, (N), of 3. However, one of ordinary skill in the art will appreciate that the N chosen is subject to system requirements and other considerations. FIG. 3 illustrates four iterations 302, 304, 306 and 308, with each identified against a time index. Furthermore, each iteration illustrates an expiration limit 310, 312, 314 and 316. At each filter iteration (k), 302, 304, 306 and 308, a measurement for an arbitrary lot or wafer, (j), is received. Data storage module 250 inserts a new measurement in the list maintained within the input/output repository 208 at the appropriate position. The appropriate position is determined in accordance with the receding horizon filter based upon the relevant process timestamp. FIG. 3 illustrates the new points as points 322, 324, 326 and 328. State/parameter estimator 206 retrieves the sorted list of input/output data from the input/output repository 208 and iterates over successive groups of N data points to arrive at a current estimate of the process state. In the example shown in FIG. 3, one of the values in the list is missing, as shown in iteration 302 by point 332. In accordance with one embodiment of the invention, state/parameter estimator 206 can apply the model 262 prediction for that point. Similarly, for iteration j+1, identified as reference numeral 304, the model 262 prediction may be applied for point 334, except that the input repository 208 must continue to retain more than N−1 data points due to the missing value in the middle of the known data. At iteration j+2, identified as reference numeral 306, the previously missing data is obtained. Data storage module 250 inserts the data 326 into the input/output repository 208 in the placeholder location for the missing data. State/parameter estimator 206 then iterates over the entire list again, this time using the actual data, not the model 262 prediction for the previously missing data point. After completion of this iteration, input/output repository 208 trims the data list to only the N−1 data points needed in anticipation of the $N^{th}$ value at the next iteration. At iteration j+3, identified as reference numeral 308, the system 200 operates as it did for iteration j, because there are no missing data points in the list.

V. Parameter Estimation

Equation (6) provides the equations that the state/parameter estimator 206 uses to update the model coefficients of the matrix $C^j$ during parameter estimation.

$$\min_{\{C^j\}} J = \sum_{i=1}^{N} (\bar{y}_i - \hat{\bar{y}}_i)' Q (\bar{y}_i - \hat{\bar{y}}_i) \begin{pmatrix} \text{for all lots from } i = 1, N \\ \text{that are product } j \end{pmatrix} \quad (6)$$

Subject to: $\hat{x}_0 = \bar{x}_0$ $\hat{x}_{i+1} = A_{i+1}\hat{x}_i + B_{i+1}u_i \quad i = 0, N - 1$ $\hat{y}_i = C_i^j \hat{x}_i \quad i = 0, N$ $\bar{y}_i = y_i - y_{i-1} \quad i = 0, N$ $\hat{\bar{y}}_i = \hat{y}_i - \hat{y}_{i-1} \quad i = 0, N$ The parameter estimator filter is similar to the state estimator filter, except that the optimization uses data for the same product/layer from multiple process tools. As discussed above, sorting module 254 sorts the data in the input/output repository's 208 database for use by the parameter estimator filter. The parameter estimator filter relies on the data manager module to substitute the missing values into the data sequence when appropriate. In this way, parameter estimation benefits from the useful handling of missing and out-of-order data handling that the data manager module provides during state estimation.

Figure 4:
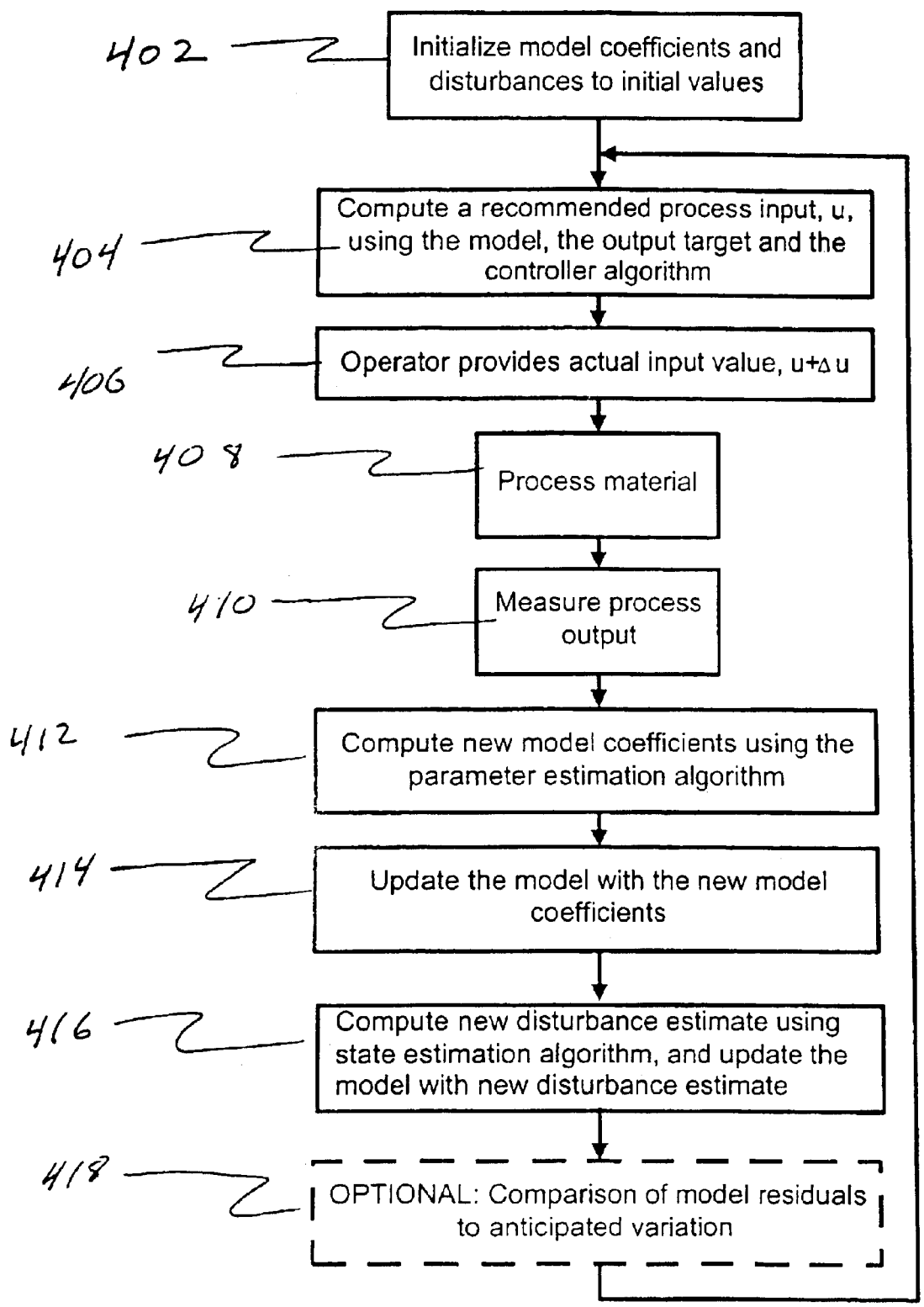
FIG. 4 is a flow diagram of a method in accordance with an embodiment of the present invention.

Referring to FIG. 4, a flow diagram illustrates the methods described above. Block 402 provides for the initialization of the model coefficients, in model 262, and the disturbances, Δu 216, to initial values. Next, in block 404, a recommended process input, u, is computed using the current model 262. The output target, y, and the controller algorithm are also computed. In block 406, the operator then provides the actual input value, v=u+Δu, to the process. The material being manufactured is then processed in block 408, and the actual process output, y, is measured in block 410. In block 412, state/parameter estimator 206 computes new coefficients for model 262 using the parameter estimation algorithm. Block 414 provides for model 262 to be updated with the new model coefficients computed in block 412. In block 416, state/parameter estimator 206 computes a new disturbance estimate using the state estimation algorithm, and model 262 is updated with this new disturbance estimate. Block 418 involves the optional process of fault detection, described below. Each time a new recommended process input, u, is computed in block 404, the current model 262, as updated in blocks 414 and 416, is used to perform the computation. As reflected in FIG. 4, the parameter estimation and state estimation occur in separate steps. However, the order of these steps is immaterial.

Referring to controller 202 in FIG. 2 in combination with FIG. 3 and FIG. 4, the state/parameter estimator 206 ensures that controller 202 always has access to the most up-to-date model. Furthermore, by substituting the predicted output of model 262 in the input/output (I/O) sequence when measurements have not been received, the estimator 206 makes the full use of all the information available to it, including the process model 262, without requiring the onerous restriction that processing wait until measurements are complete. A common prior art approach ignores the lot with the missing measurement, essentially assuming that the error for that lot is zero. Another prior art approach is to delay estimation until the time that the controller must supply a new input to the process. This prior art approach causes excessively slow controller calculations and does not address the missing values problem. It does reduce the number of missing values in the sequence, on average, because by waiting the controller allows more time to complete measurements in unmeasured lots or wafers.

Those skilled in the art will recognize that other filtering approaches, besides those described above, could be used during parameter and state estimation. For example, a $1^{st}$ order filter or Kalman filter could be used. However, the filtering approaches described above allow for the handling of constraints, which cannot be handled with these other filtering approaches.

VI. Fault Detection

Fault detection applications require a bit of additional processing. In many fault detection applications, the initial condition of the states following a maintenance event, like wet cleans in plasma etchers, confuse the fault detection algorithm into identifying a fault when none really exists. The state/parameter estimator 206 compensates for these shifts by estimating the initial state from initial wafer processing in the same way as described above in the State Estimation section. In addition, the fault detection algorithms suffer from the same problem as R2R controllers based upon models built from blanket wafers, rather than product wafers. The $C^j$ matrix provides the relationship between the blanket wafer model and the product wafer model for each product j. These two capabilities allow initial modeling based on blanket wafers, lowering the cost of model development, and compensate for performance shifts of process tools following maintenance events.

The additional-processing required for fault detection is that following state and parameter estimation, the model 262 residuals must be compared to the measured data. Since both parameter estimation and state estimation provide confidence estimates for their respective outputs, the system can compare the model residuals to the expected levels of variation and identify faults when the measured data fall outside the anticipated confidence intervals. Sufficient measurement data must be accumulated before fault detection becomes reliable. It is believed that measurement data of about two to three times the number of states being measured is sufficient to reliably determine if a fault is occurring. In an alternative embodiment, fault detection could begin when the confidence limits have been reduced to a pre-defined value.

As discussed below, two steps are involved in the confidence interval (CI) calculation: (1) whiteness test and (2) calculating CI. The whiteness test will test the property of the residual (or predicted output "error") which gives the "confidence" of the CI calculation.

A. CI Calculation for Parameter Estimation

The following steps are used to calculate CI for parameter estimation,

1. Test whiteness of residuals.
2. Calculate estimated covariance matrix of the residual.
3. Use the result from step (2) to calculate estimated covariance matrix of estimated parameter, $P_N$
4. Denote $P_N^{ii}$ to be the $i^{th}$ diagonal element of $P_N$, then, $$Z = \frac{\hat{\theta}_N^i - \theta^i}{\sqrt{P_N^{ii}}} \sim N(0, 1) \quad (7)$$

where $N(0,1)$ is the standard normal distribution with zero mean and variance one. For the given significant level a (for example, the value of 2.17 represents the level of significance of 3%), $$\hat{\theta}_N^i - \alpha\sqrt{P_N^{ii}} < \theta^i < \hat{\theta}_N^i + \alpha\sqrt{P_N^{ii}} \quad (8)$$

where $\hat{\theta}_N^i$ is the $i^{th}$ estimated parameter, and $\theta^i$ is the $i^{th}$ real parameter. See S. Weisberg, Applied Linear Regression (Second Edition), John Wiley & Sons (1985), which is incorporated herein by reference 1. Whiteness Test To test the whiteness of the residuals, let $$\epsilon_N = (Y_N^y - \hat{Y}_N^y) = [\epsilon_{11}\ \epsilon_{21}\ \ldots\ \epsilon_{n_y 1}\ \epsilon_{12}\ \ldots\ \epsilon_{n_y 2}\ \ldots\ \epsilon_{1N}\ \ldots\ \epsilon_{n_y N}]' \quad (9)$$

where $Y_N^y$ is the vector of measured output, and $\hat{Y}_N^y$ is the vector of predicted output. For missing measurements, the value of the measurement will be replaced by a predicted value from the model 262. Then, the following are computed:

$$R_i(0) = \frac{1}{N}\sum_{m=1}^{N}\epsilon_{i,m}^2, NR_i(0) = \frac{R_i(0)}{R_i(0)} = 1, i = 1, 2, \ldots, n_y \quad (10)$$

$$R_i(k) = \frac{1}{N}\sum_{m=1}^{N}\epsilon_{i,m}\epsilon_{i,m-k}, NR_i(k) = \frac{R_i(0)}{R_i(k)}, i = 1, 2, \ldots, n_y \quad (11)$$

The whiteness test could be stated as below: a rejection of residual prediction error being white noise has in general, $$|RN_i(k)| > \frac{\alpha}{\sqrt{N}}, \text{ for any of } k > 1, i = 1, 2, \ldots, n_y \quad (12)$$

where α represents the significant level, and could be found from t-statistics table (for example, the value of 2.17 represents the level of significance of 3%).

2. CI Calculation

After the whiteness test, the estimated co-variance matrix of the residual is calculated as follows:

$$\lambda_N = \frac{1}{N-d}(Y_N^y - \hat{Y}_N^y)'(Y_N^y - \hat{Y}_N^y) \quad (13)$$

$$R_N = \lambda_N I \quad (14)$$

where, $Y_N^y - \hat{Y}_N^y$ is defined in equation (9).

The estimated co-variance matrix of estimated parameter, $P_N$, is determined as follows:

$$P_N = (\Phi'_N Q \Phi_N)^{-1} \Phi'_N Q R_N Q \Phi_N (\Phi'_N Q \Phi_N)^{-1} \quad (15)$$

Next, denote $P_N^{ii}$ to be the $i^{th}$ diagonal element of $P_N$, then, $$Z = \frac{\hat{\theta}_N^i - \theta^i}{\sqrt{P_N^{ii}}} \sim N(0, 1) \quad (16)$$

For the given significant level α, $$\hat{\theta}_N^i - \alpha\sqrt{P_N^{ii}} < \theta^i < \hat{\theta}_N^i + \alpha\sqrt{P_N^{ii}} \quad (17)$$

B. CI Calculation for State Estimation

The following steps are used to calculate CI for state estimation,

1. Test whiteness of estimated state disturbance.
2. Calculate estimated covariance matrix of estimated states, $P_N$
3. Denote $P_N^{ii}$ to be the $i^{th}$ diagonal element of $P_N$, then, $$Z = \frac{\hat{x}_N^i - x^i}{\sqrt{P_N^{ii}}} \sim N(0, 1) \quad (18)$$

where $N(0,1)$ is the standard normal distribution with zero mean and variance one. For the given significant level α (for example, the value of 2.17 represents the level of significance of 3%), $$\hat{x}_N^i - \alpha\sqrt{P_N^{ii}} < x^i < \hat{x}_N^i + \alpha\sqrt{P_N^{ii}} \quad (19)$$

where $\hat{x}_N^i$ is the $i^{th}$ estimated state, and $x_i$ is the $i^{th}$ real state.

1. Whiteness Test

To test whiteness of the estimated state disturbance, let $$\epsilon_N = [\hat{\epsilon}_{11}\ \hat{\epsilon}_{21}\ \ldots\ \hat{\epsilon}_{n_s 1}\ \hat{\epsilon}_{12}\ \ldots\ \hat{\epsilon}_{n_s 2}\ \ldots\ \hat{\epsilon}_{1N}\ \ldots\ \hat{\epsilon}_{n_s N}]' \quad (20)$$

where $\epsilon_N$ is the vector of estimated state disturbance, $n_s$ is the number of states, and N is the estimation horizon. Then, the following are computed:

$$R_i(0) = \frac{1}{N}\sum_{m=1}^{N} \hat{\epsilon}_{i,m}^2, \quad NR_i(0) = \frac{R_i(0)}{R_i(0)} = 1, \quad i = 1, 2, \ldots, n_s \quad (21)$$

$$R_i(k) = \frac{1}{N}\sum_{m=1}^{N} \hat{\epsilon}_{i,m}\hat{\epsilon}_{i,m-k}, \quad NR_i(k) = \frac{R_i(0)}{R_i(k)}, \quad i = 1, 2, \ldots, n_s \quad (22)$$

The whiteness test could be stated as below: a rejection of state disturbance being white noise has in general, $$|RN_i(k)| > \frac{\alpha}{\sqrt{N}}, \quad \text{for any of } k > 1, \quad i = 1, 2, \ldots, n_s \quad (23)$$

where $\alpha$ represents the significant level, and could be found from t-statistics table (for example, the value of 2.17 represents the level of significance of 3%).

2. CI Calculation

When the state disturbance is white, the co-variance matrix of the current estimated states is given by, $$P_N = \begin{bmatrix} R_1(0) & & 0 \\ & \ddots & \\ 0 & & R_{n_s}(0) \end{bmatrix} \quad (24)$$

Then $$Z = \frac{\hat{x}_N^i - x^i}{\sqrt{R_i(0)}} \sim N(0, 1) \quad i = 1, 2, \ldots n_s \quad (25)$$

where $x_i$ is the $i^{th}$ state of the process. For the given significant level $\alpha$, $$\hat{x}_N^i - \alpha\sqrt{R_i(0)} < x^i < \hat{x}_N^i + \alpha\sqrt{R_i(0)} \quad (26)$$

Principle Component Analysis (PCA) is used to detect faults. The smallest loading vector is determined by the percent variance method, and residuals are projected from the loading factor.

Figure 5:
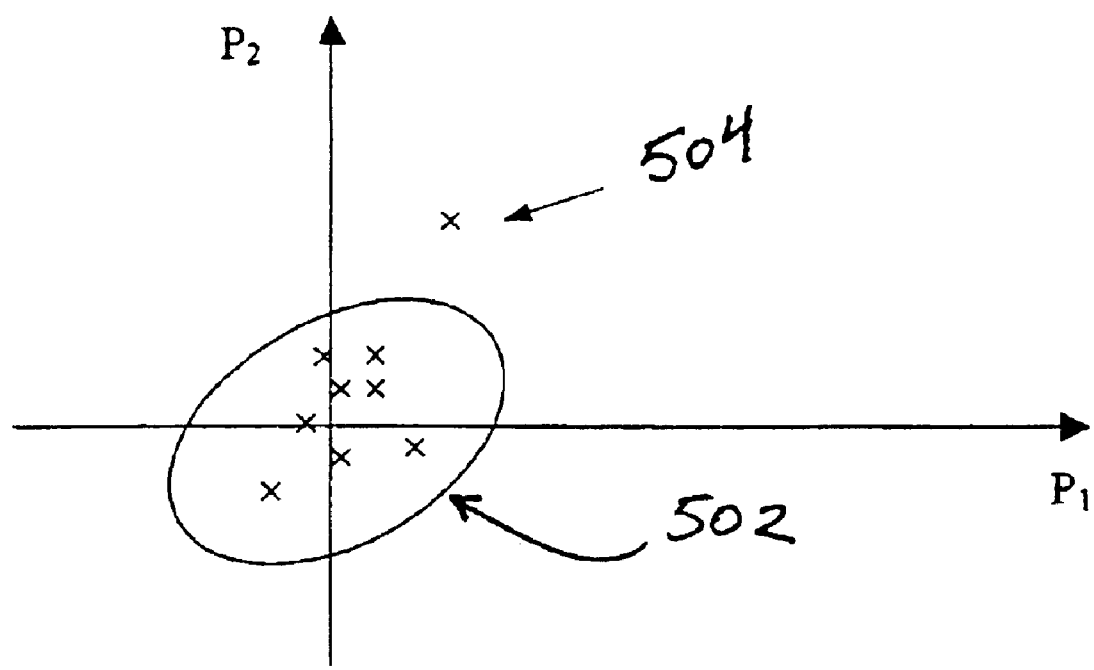
FIG. 5 illustrates a confidence region during fault detection in accordance with an embodiment of the present invention.

As illustrated in FIG. 5, a threshold (from a confidence interval, e.g., 95%) defines a hyper-elliptical confidence region 502. Any residuals outside this region 502 will be considered to be a fault. An example of a fault is identified by reference numeral 504.

When a fault is detected, the control system may set to alarm or shut down the tool.

V. Other Embodiments

Those skilled in the art will appreciate that embodiments disclosed herein may be implemented as software program instructions capable of being distributed as one or more program products, in a variety of forms, including computer program products, and that the present invention applies equally regardless of the particular type of program storage media or signal bearing media used to actually carry out the distribution. Examples of program storage media and signal bearing media include recordable type media such as floppy disks, CD-ROM, and magnetic tape transmission type media such as digital and analog communications links, as well as other media storage and distribution systems.

Additionally, the foregoing detailed description has set forth various embodiments of the present invention via the use of block diagrams, flowcharts, and/or examples. It will be understood by those skilled within the art that each block diagram component, flowchart step, and operations and/or components illustrated by the use of examples can be implemented, individually and/or collectively, by a wide range of hardware, software, firmware, or any combination thereof. The present invention may be implemented as those skilled in the art will recognize, in whole or in part, in standard Integrated Circuits, Application Specific Integrated Circuits (ASICs), as a computer program running on a general-purpose machine having appropriate hardware, such as one or more computers, as firmware, or as virtually any combination thereof and that designing the circuitry and/or writing the code for the software or firmware would be well within the skill of one of ordinary skill in the art, in view of this disclosure.

While the invention has been described with respect to the embodiments and variations set forth above, these embodiments and variations are illustrative and the invention is not to be considered limited in scope to these embodiments and variations. Accordingly, various other embodiments and modifications and improvements not described herein may be within the spirit and scope of the present invention, as defined by the following claims.

What is claimed is:

1. A method for controlling a manufacturing process, includes:

processing using a process input and producing a process output; storing the process input in a database;

storing at least one measurement of the process output in the database associated with each process input;

iterating over data from the database to estimate one or more coefficients for a model;

if one or more measurements is missing from the database during model coefficient estimation, replacing the missing measurements for the database based on a prediction from said model;

updating said model with said coefficient estimates; iterating over data from the database to estimate a process state;

if one or more measurements is missing from the database during process state estimation, replacing the missing measurements for the database based on a prediction from said model; and updating said model with said process state estimate.

2. A method for controlling a manufacturing process, includes:

processing using a process input and producing a process output; storing the process input in a database;

storing at least one measurement of the process output in the database associated with each process input;

iterating over data from the database to estimate one or more coefficients for a model;

if one or more measurements is missing from the database during model coefficient estimation, replacing the missing measurements for the database based on a prediction from said model;

updating said model with said coefficient estimates; iterating over data from the database to estimate a process state;

if one or more measurements is missing from the database during process state estimation, replacing the missing measurements for the database based on a prediction from said model; and updating said model with said process state estimate; and wherein if actual measurements become available a time period after model coefficient estimation or process state estimation, for said one or more measurements which was missing, replacing the predicted measurements for the previously missing measurements with said actual measurements, storing said actual measurements in said database, and utilizing said actual measurements in subsequent model coefficient estimation and process state estimation.

3. The method of claim 1 wherein a controller receives the updated model and utilizes said updated model to produce the next process input.

4. The method of claim 3 wherein the controller comprises one or more of a model-predictive control (MPC) type controller, a direct model inverter type controller, and a simple integral controller.

5. The method of claim 3 wherein the controller minimizes the error in each run of the process using the estimate of the process state.

6. The method of claim 1 wherein the process operates on either a lot or a part of a lot of semiconductor devices.

7. The method of claim 1 wherein the database is coupled to one or more modules that operate on the database.

8. The method of claim 7 wherein the modules include an estimation module, a compute module, a sort module, a pairing module and a data storage module.

9. The method of claim 1 wherein said model coefficient estimation and said process state estimation includes providing a confidence limit.

10. The method of claim 9 further including utilizing said updated model to generate an estimate for a measurable process variable, and comparing an actual measurement to said estimate to determine if said estimate is within said confidence limits, wherein if said estimate is not within said confidence limits, a fault is indicated.

11. The method of claim 2 wherein said time period can be variable.

12. The method of claim 1 wherein the replacing of missing measurements for the database is accomplished either explicitly or implicitly.

13. The method of claim 1 further including solving a constrained quadratic optimization at each iteration of said data.

14. The method of claim 1 wherein said storing of the process input includes providing a timestamp, and wherein said at least one measurement of the process output is associated with each process input using the timestamp.

15. A method for controlling a manufacturing process, includes:
processing using a process input and producing a process output; storing the process input in a database;
storing at least one measurement of the process output in the database associated with each process input;
iterating over data from the database to estimate one or more coefficients for a model, wherein a constrained quadratic optimization is solved at each iteration of said data;
if one or more measurements is missing from the database during model coefficient estimation, replacing the missing measurements for the database based on a prediction from said model;
updating said model with said coefficient estimates;
iterating over data from the database to estimate a process state, wherein a constrained quadratic optimization is solved at each iteration of said data;
if one or more measurements is missing from the database during process state estimation, replacing the missing measurements for the database based on a prediction from said model; and
updating said model with said process state estimate.

16. A method for controlling a manufacturing process, includes:
processing using a process input and producing a process output; storing the process input in a database;
storing at least one measurement of the process output in the database associated with each process input;
iterating over data from the database to estimate one or more coefficients for a model, wherein a constrained quadratic optimization is solved at each iteration of said data;
if one or more measurements is missing from the database during model coefficient estimation, replacing the missing measurements for the database based on a prediction from said model;
updating said model with said coefficient estimates;
iterating over data from the database to estimate a process state, wherein a constrained quadratic optimization is solved at each iteration of said data;
if one or more measurements is missing from the database during process state estimation, replacing the missing measurements for the database based on a prediction from said model; and
updating said model with said process state estimate; and
wherein if actual measurements become available a time period after model coefficient estimation or process state estimation, for said one or more measurements which was missing, replacing the predicted measurements for the previously missing measurements with said actual measurements, storing said actual measurements in said database, and utilizing said actual measurements in subsequent model coefficient estimation and process state estimation.

17. The method of claim 15 wherein a controller receives the updated model and utilizes said updated model to produce the next process input.

18. The method of claim 17 wherein the controller comprises one or more of a model-predictive control (MPC) type controller, a direct model inverter type controller, and a simple integral controller.

19. The method of claim 17 wherein the controller minimizes the error in each run of the process using the estimate of the process state.

20. The method of claim 15 wherein the process operates on either a lot or a part of a lot of semiconductor devices.

21. The method of claim 15 wherein the database is coupled to one or more modules that operate on the database.

22. The method of claim 21 wherein the modules include an estimation module, a compute module, a sort module, a pairing module and a data storage module.

23. The method of claim 15 wherein said model coefficient estimation and said process state estimation includes providing a confidence limit.

24. The method of claim 23 further including utilizing said updated model to generate an estimate for a measurable process variable, and comparing an actual measurement to said estimate to determine if said estimate is within said confidence limits, wherein if said estimate is not within said confidence limits, a fault is indicated.

25. The method of claim 16 wherein said time period can be variable.

26. The method of claim 15 wherein the replacing of missing measurements for the database is accomplished either explicitly or implicitly.

27. The method of claim 15 wherein said storing of the process input includes providing a timestamp, and wherein said at least one measurement of the process output is associated with each process input using the timestamp.

28. A method for controlling a manufacturing process, includes:

providing a database with process input data and associated process output data; iterating over data from the database to estimate one or more coefficients for a model; if one or more measurements is missing from the database during model coefficient estimation, replacing the missing measurements for the database based on a prediction from said model;

updating said model with said coefficient estimates; iterating over data from the database to estimate a process state;

if one or more measurements is missing from the database during process state estimation, replacing the missing measurements for the database based on a prediction from said model; and updating said model with said process state estimate.

29. A method for controlling a manufacturing process, includes:

providing a database with process input data and associated process output data; iterating over data from the database to estimate one or more coefficients for a model; if one or more measurements is missing from the database during model coefficient estimation, replacing the missing measurements for the database based on a prediction from said model;

updating said model with said coefficient estimates; iterating over data from the database to estimate a process state;

if one or more measurements is missing from the database during process state estimation, replacing the missing measurements for the database based on a prediction from said model; and updating said model with said process state estimate; and wherein if actual measurements become available a time period after model coefficient estimation or process state estimation, for said one or more measurements which was missing, replacing the predicted measurements for the previously missing measurements with said actual measurements, storing said actual measurements in said database, and utilizing said actual measurements in subsequent model coefficient estimation and process state estimation.

30. The method of claim 28 wherein said model coefficient estimation and said process state estimation includes providing a confidence limit.

31. The method of claim 30 further including utilizing said updated model to generate an estimate for a measurable process variable, and comparing an actual measurement to said estimate to determine if said estimate is within said confidence limits, wherein if said estimate is not within said confidence limits, a fault is indicated.

32. The method of claim 29 wherein said time period can be variable.

33. The method of claim 28 wherein the replacing of missing measurements for the database is accomplished either explicitly or implicitly.

34. The method of claim 28 further including solving a constrained quadratic optimization at each iteration of said data.

35. A program storage media readable by a machine and containing instructions for performing the method contained in claim 1.

36. A program storage media readable by a machine and containing instructions for performing the method contained in claim 15.

37. A program storage media readable by a machine and containing instructions for performing the method contained in claim 28.

* * * * *